(12) United States Patent
Saado

(10) Patent No.: US 7,680,872 B2
(45) Date of Patent: Mar. 16, 2010

(54) CANONICAL SIGNED DIGIT (CSD) COEFFICIENT MULTIPLIER WITH OPTIMIZATION

(75) Inventor: Alon Saado, San Diego, CA (US)

(73) Assignee: VIA Telecom Co., Ltd., San Diego, CA (US)

( * ) Notice: Subject to any disclaimer, the term of this patent is extended or adjusted under 35 U.S.C. 154(b) by 1075 days.

(21) Appl. No.: 11/032,920

(22) Filed: Jan. 11, 2005

(65) Prior Publication Data

US 2006/0155793 A1 Jul. 13, 2006

(51) Int. Cl.
*G06F 7/52* (2006.01)
(52) U.S. Cl. .................. 708/620; 708/235; 708/300
(58) Field of Classification Search ............... 708/300, 708/620–625
See application file for complete search history.

(56) References Cited

U.S. PATENT DOCUMENTS

| | | | | |
|---|---|---|---|---|
| 4,816,805 A * | 3/1989 | Vojir et al. ................ 341/83 |
| 5,117,385 A * | 5/1992 | Gee ........................... 708/625 |
| 5,313,414 A * | 5/1994 | Yang et al. ................. 708/625 |
| 5,548,542 A * | 8/1996 | Rauth et al. ................ 708/319 |
| 6,466,633 B1 * | 10/2002 | Laufer ........................ 375/350 |
| 6,505,221 B1 * | 1/2003 | Maschmann ............... 708/306 |
| 7,080,115 B2 * | 7/2006 | Parhi et al. ................. 708/625 |
| 7,257,609 B1 * | 8/2007 | Kosunen et al. ........... 708/493 |
| 2002/0075953 A1 * | 6/2002 | Lim et al. .................. 375/232 |

* cited by examiner

*Primary Examiner*—Lewis A Bullock, Jr.
*Assistant Examiner*—Michael Yaary
(74) *Attorney, Agent, or Firm*—Christopher P. Maiorana, PC

(57) ABSTRACT

An apparatus comprising an address generation circuit, a lookup table, a multiplexer and an output circuit. The address generation circuit may be configured to generate a series of addresses. The lookup table may be configured to generate one or more coefficients in response to the addresses. The multiplexer circuit may be configured to generate one or more shifted values in response to (i) the coefficients and (ii) the one or more operands. The output circuit may be configured to generate an output signal by combining one or more component values in response to said shifted values. The coefficients are grouped as one over power of 2 components into mutually exclusive groups.

20 Claims, 3 Drawing Sheets

CANONICAL SIGNED DIGIT (CSD) COEFFICIENT MULTIPLIER WITH OPTIMIZATION

FIELD OF THE INVENTION

The present invention relates to a method and/or architecture for digital filters generally and, more particularly, to a canonical signed digit (CSD) coefficient multiplier with optimization.

BACKGROUND OF THE INVENTION

Conventional systems use coefficient multipliers in digital filters, such as with a Finite Impulse Response (FIR) filters, as well as within other applications. The multiplier may contain set of coefficients. The coefficients are multiplied with operands that are supplied to the multiplier. Each operand may be multiplied by a coefficient. The product is presented on the output for use within the next level (i.e., a summation of the products).

Conventional multipliers are generally implemented with combinations of shift and add operations. Some such implementations have a high gate count, which can result in an inefficient use of chip area.

It would be desirable to implement a multiplier that may be implemented with a minimal number of shift and add operations and/or may be implemented using a minimal amount of chip area.

SUMMARY OF THE INVENTION

The present invention concerns an apparatus comprising an address generation circuit, a lookup table, a multiplexer and an output circuit. The address generation circuit may be configured to generate a series of addresses. The lookup table may be configured to generate one or more coefficients in response to the addresses. The multiplexer circuit may be configured to generate one or more shifted values in response to (i) the coefficients and (ii) the one or more operands. The output circuit may be configured to generate an output signal by combining one or more component values in response to said shifted values. The coefficients are grouped as one over power of 2 components into mutually exclusive groups.

The objects, features and advantages of the present invention include implementing a coefficient multiplier that may (i) use CSD representation for the coefficients, (ii) reduce the multiplier complexity, (iii) reduce the gate count needed, (iv) implement the number of one over power of 2 components according to an error that a particular application can tolerate, (v) be implemented with a lower gate count than a conventional approach, (vi) a modular and flexible implementation and structure, (vii) implement coefficients that can be programmable or fixed, and/or (viii) perform optimization when the coefficients are known to reduce the gate count by grouping the components to mutually exclusive groups.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
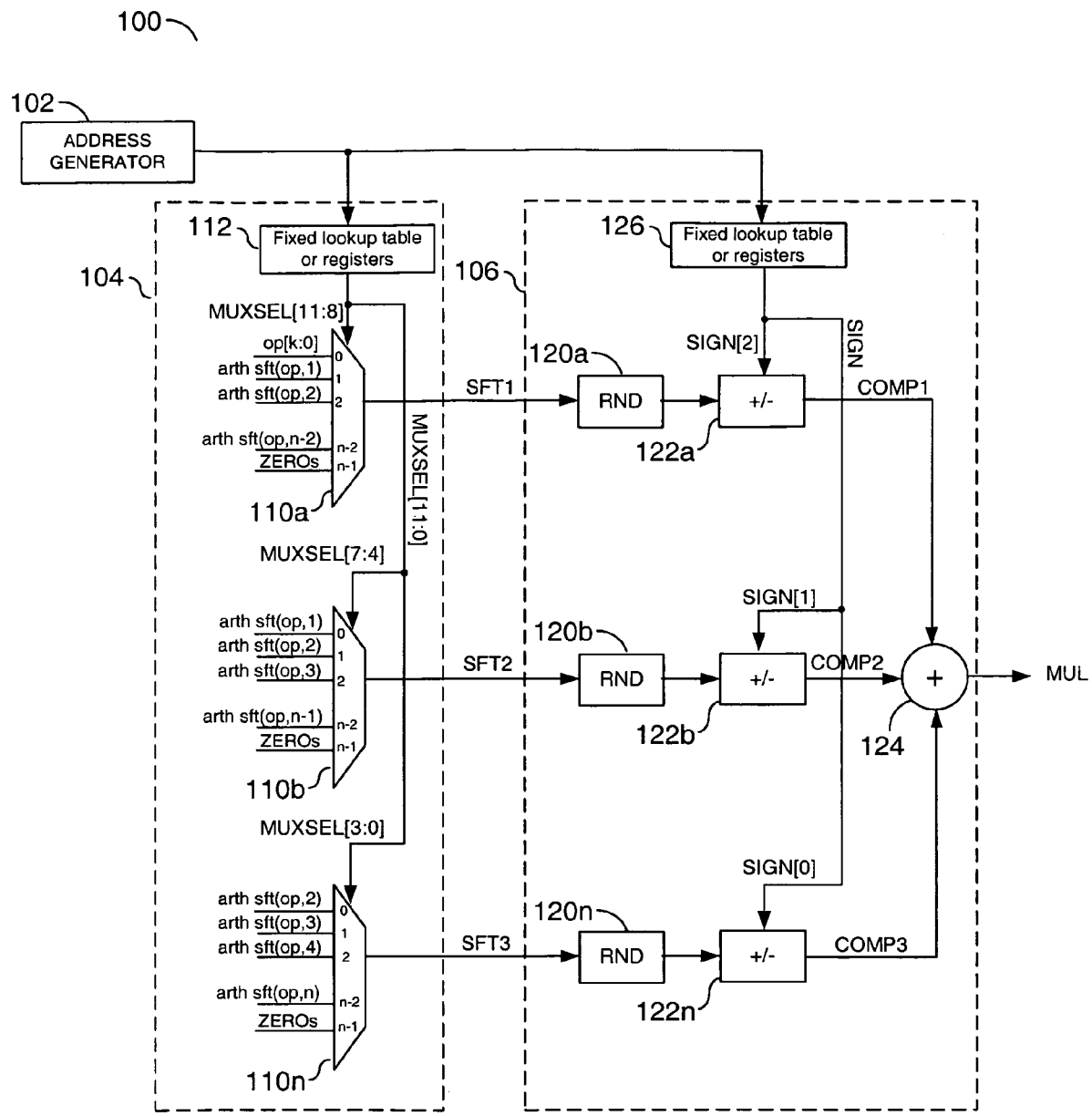
FIG. 1 is a diagram of a coefficient multiplier in accordance with the present invention.

Referring to FIG. 1, a block diagram of a circuit 100 is shown in accordance with a preferred embodiment of the present invention. The circuit 100 may be implemented as a multiplier circuit. In one example, the circuit may be a canonical signed digit (CSD) coefficient multiplier. The circuit 100 generally comprises a block (or circuit) 102, a block (or circuit) 104 and a block (or circuit) 106. The block 102 may be implemented as an address generator. The block 104 may be implemented as a multiplexer block (or section). The block 106 may be implemented as an adder section. In one example, the block 106 may be implemented as a products/components adder circuit.

The multiplexer section 104 generally comprises a number of sub-multiplexers 110a-110n and a lookup table 112. The particular number of multiplexers 110a-110n may be varied to meet the design criteria of a particular implementation. The adder circuit 106 generally comprises a number of rounder blocks (or circuits) 120a-120n, a number of converter blocks (or circuits) 122a-122n, an adder circuit 124 and a lookup table 126.

The multiplier circuit 100 may contain a set of coefficients generated, in part, by the select inputs (e.g., MUXSEL) of the multiplexers 110a-110n. In one implementation, the coefficients may be represented in Canonical Signed Digit (CSD) representation. Each coefficient may have one or more components. The coefficients are generally stored in the lookup table 112. The coefficients are multiplied by an operand OP, presented to the multiplexers 110a-110n. A shifted value of the operand OP (e.g., shown as the inputs (OP,1), (OP,2), (OP,n−2), etc.) is presented to the various inputs of the multiplexers 110a-110n. The shifted versions of the operand OP may be arithmetic shifted versions of the operand OP, shown generally with the prefix "arth sft" in FIG. 1. Each of the shifted values of the operand OP may be selected by the select signal MUXSEL. Each of the multiplexers 110a-110n presents a product that is generally equal to the operand OP multiplied by one component of the coefficient. After the circuit 106 adds all of the products, the final product is presented as an output signal (e.g., MUL). The coefficients are represented as a sum and/or difference of a number of one over power of 2 numbers. In general, for coefficients equal or smaller than 1, a coefficient may be calculated using the following equation EQ1:

$$Coef = \sum_{n=0}^{M} Z * \text{Sign} * \frac{1}{2^n} \quad \text{EQ1}$$

where, "Sign" is + or −, "Z" is 0 or 1 and "M" is a number used to represent a coefficient as $\frac{1}{2^M}$, which is ideally the smallest component needed to represent the coefficients in a certain implementation.

For example, a coefficient with 3 components (e.g., the coefficient 0.929688) may be represented as $1-\frac{1}{16}-\frac{1}{128}$ (i.e., $\frac{1}{2^0}-\frac{1}{2^4}-\frac{1}{2^7}$). The coefficient 0.263672 may be represented as $\frac{1}{4}+\frac{1}{64}-\frac{1}{512}$ (i.e., $\frac{1}{2^2}+\frac{1}{2^6}-\frac{1}{2^9}$). By using such a system, the multiply operation may be done by using a small number of shifters and adders. The more one over power of 2 components that each coefficient has, the more accuracy the circuit 100 achieves, but at the expense of a higher gate count. The number of one over power of 2 components depends on the error that a particular design implementation can tolerate. The circuit 100 allows a tradeoff to be made between accuracy and gate count.

The coefficients in the example above may be stored in the lookup tables 112 and 126 according to the following TABLE 1:

TABLE 1

|  | | Coefficient 1 = 0.929688 = $1/2^0 - 1/2^4 - 1/2^7$ | | Coefficient 2 = 0.263672 = $1/2^2 + 1/2^6 - 1/2^9$ | |
|---|---|---|---|---|---|
|  |  | Sign 0 => + 1 => − | Component | Sign 0 => + 1 => − | Component |
| $1/2^N$ | N = 0 | 0 | 1 | 0 | 0 |
|  | N = 1 | 0 | 0 | 0 | 0 |
|  | N = 2 | 0 | 0 | 0 | 1 |
|  | N = 3 | 0 | 0 | 0 | 0 |
|  | N = 4 | 1 | 1 | 0 | 0 |
|  | N = 5 | 0 | 0 | 0 | 0 |
|  | N = 6 | 0 | 0 | 0 | 1 |
|  | N = 7 | 1 | 1 | 0 | 0 |
|  | N = 8 | 0 | 0 | 0 | 0 |
|  | N = 9 | 0 | 0 | 1 | 1 |
|  | N = 10 | 0 | 0 | 0 | 0 |

With such an example, the last component that may be used is $\frac{1}{2}^{10}$ (e.g., where M=10). A '1' in the 'Component' column indicates that a specific one over power of 2 component is needed. A '1' in the 'Sign' column indicates that a negative value is used. A 'O' in the 'Sign' column indicates that a positive value is used.

The select signal MUXSEL is generally used to generate a product that is equal to the operand multiplied by one unsigned component of the coefficient. A specific shifted value of the operand is generally selected according to a specific one over power of 2 component of the coefficient. For example, in a case where the component of the coefficient is ¼ (e.g., $\frac{1}{2}^2$), then by selecting the arithmetic shift by 2 of the operand OP, the product is equal to ¼ multiplied by the operand (e.g., ¼*OP). The select signal MUXSEL may be presented to the select input of each of multiplexers 110a-110n. The select signal MUXSEL may be implemented as a multi-bit signal. A control signal (e.g., SIGN) is generally presented to a control input of each of the converters 122a-122n. The signal SIGN may be implemented as a multi-bit signal. The values used to generate the signal MUXSEL and the signal SIGN may be extracted from TABLE 1. For the coefficients above, the lookup tables 112 and 126 may be represented by the following TABLE 2:

TABLE 2

|  | (Table 112) MUXSEL[11:0] | (Table 126) SIGN[2:0] |
|---|---|---|
| Coef 1 | 0000_0100_0111 | 011 |
| Coef 2 | 0010_0110_1001 | 001 |

In such an example, three one over power of 2 numbers are used (a zero may be used as well). In such an example, three multiplexers 110a-110n may be implemented. However, the particular number of multiplexers 110a-110n implemented may be varied to meet the design criteria of a particular implementation. The number of component signals COMP1-COMP3 generated depends on the error that a particular design can tolerate. In general, the more parallel component signals COMP1-COMP3 in the multiplier circuit 100, the higher the accuracy.

The operation of the circuit 100 is an operand multiplied by a coefficient. In the case shown in FIG. 1, the coefficients may not necessarily be fixed and may be loaded with values according to the particular coefficients that are used at a particular time. One of the inputs to the multiplexers 110a-110n may be the operand OP[k:0]. The other inputs to the multiplexers 110a-110n may be arithmetic right shifts (e.g., arth sft (OP,1)), where the operand OP[k:0] is right shifted by N, where k is greater than or equal to N, and N is an integer. The sign of the operand (i.e., the most significant bit) is extended.

In general, K is the index of the most significant bit. For example, if the operand has 13 bits (OP[12:0]), K=12. M is the index of the smallest component that is needed to represent the coefficients. For example, if the smallest component is ½^9, M is equal to 9. In table 1, M=10. In the example of table 3, M=8. That is independent of the operand size. N is an index and integer that is used in the components. The range is from 0 to M in that invention.

Each of the multiplexers 110a-110n may present a shifted value output (e.g., SFT1, SFT2, SFT3) to a different one of the rounders 120a-120n of the adder section 106. The rounders 120a-120n may operate as unsigned components. The rounders add $\frac{1}{2}^k$ to each shifted value (e.g., by adding 1 to each shifted value, where k is the index of the MSB of the operand OP). After a number of arithmetic shifts (e.g., between 1 and M), a negative number may comprise all '1's, which results in a −1 (instead of a very small negative number). The particular number of shifts needed to get all "1"s may vary. In some cases, 3 shifts may be sufficient. In other cases, 10 or more shifts may be needed. The rounder adds $\frac{1}{2}^k$ to the number and converts an all '1' number to 0.

The value on the output of the rounders 120a-120n may be inverted (e.g., negated) by the converter circuits 122a-122n depending on the control signal from the SIGN from lookup table 126. All of the component signals COMP1, COMP2, COMP3 are summed to create the output signal MUL.

The circuit 100 may be used when the values of coefficients are not known. The lookup tables 112 and 126 may be loaded with values according to the coefficients that are used at certain times. The number of components that are added to generate the final product (e.g., the multiplexers 11a-10n, the rounders 120a-120n, etc.) may be modified easily by adding or taking out branches according to a particular design specification (e.g., to achieve a particular tolerance). The circuit 100 may be used where an operand OP[k:0] is supplied every clock cycle. The result may be available after a number of gate delays and may be used in the next clock cycle.

Figure 2:
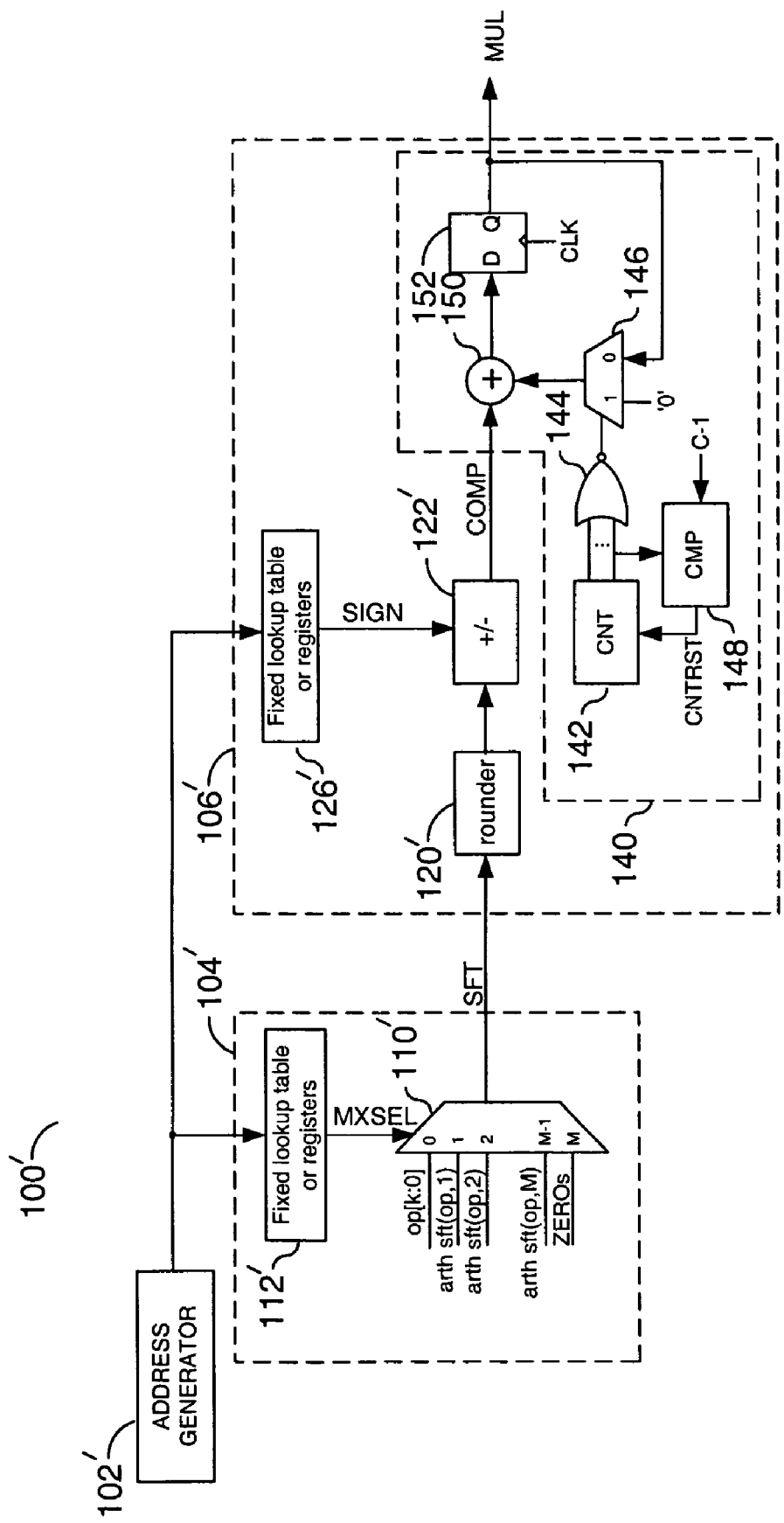
FIG. 2 is a diagram of a coefficient multiplier with an adder.

Referring to FIG. 2, a diagram of an implementation of a circuit 100' is shown with a multiplier that may be optimized using multiple clock cycles. When the multiplication result is not needed in the next clock cycle after the operand OP[k:0] is valid, or when a faster clock may be used to perform the multiplication, such an implementation may be simplified and a lower gate count may be achieved.

In one example, implementing only one multiplexer 110', only one rounder 120' and one sign module 122' may be sufficient. The inputs to the multiplexer 110' represent the operand OP[k:0], arithmetic right shifts of the operand OP[k:0], and Zeros. In such an implementation, the components of each coefficient are multiplied by the operand OP[k:0] one at time and the products are added. After all of the products are added, the final product is available on the output MUL.

The outputs of the multiplexer 110' may be products of the operand OP multiplied by one or more specific unsigned components according to the select signal MUXSEL from the lookup table 112'. The circuit 104' presents a shifted value signal (e.g., SFT) that may be rounded and negated by the circuit 106' to generate a component signal (e.g., COMP). The component signal COMP is then added to a sum after the next edge of a clock. An adder block 140 may be implemented as a counter 142, gate 144, a multiplexer 146, a comparator 148, an adder 150 and one or more flip-flops (or registers) 152. The gate 144 may be used to supply a select signal to the multiplexer 146. The counter 142 counts from 0 to C−1, where C is the number of components that are used to represent a particular coefficient. In the beginning of each multiplication, the counter 142 is zero and the output of the multiplexer 146 is zero, which is added up to the component signal COMP with the adder 150. The register 152 stores a temporary sum. In the next clock cycle, the temporary sum is added to the next component signal COMP. When the counter presents C−1, a comparator 148 presents an output signal (e.g., CNTRST) that is asserted to reset the counter 142. After C cycles, the final product is presented as the multiplier output MUL (e.g., the output of the register 152).

The number of components that are added to generate the final product may be modified easily to meet a particular design specification. Such modification may be done by changing the size of the adder block 140 and the lookup table 112' and 126' (i.e., similar to adding or taking out branches from the general implementation).

Figure 3:
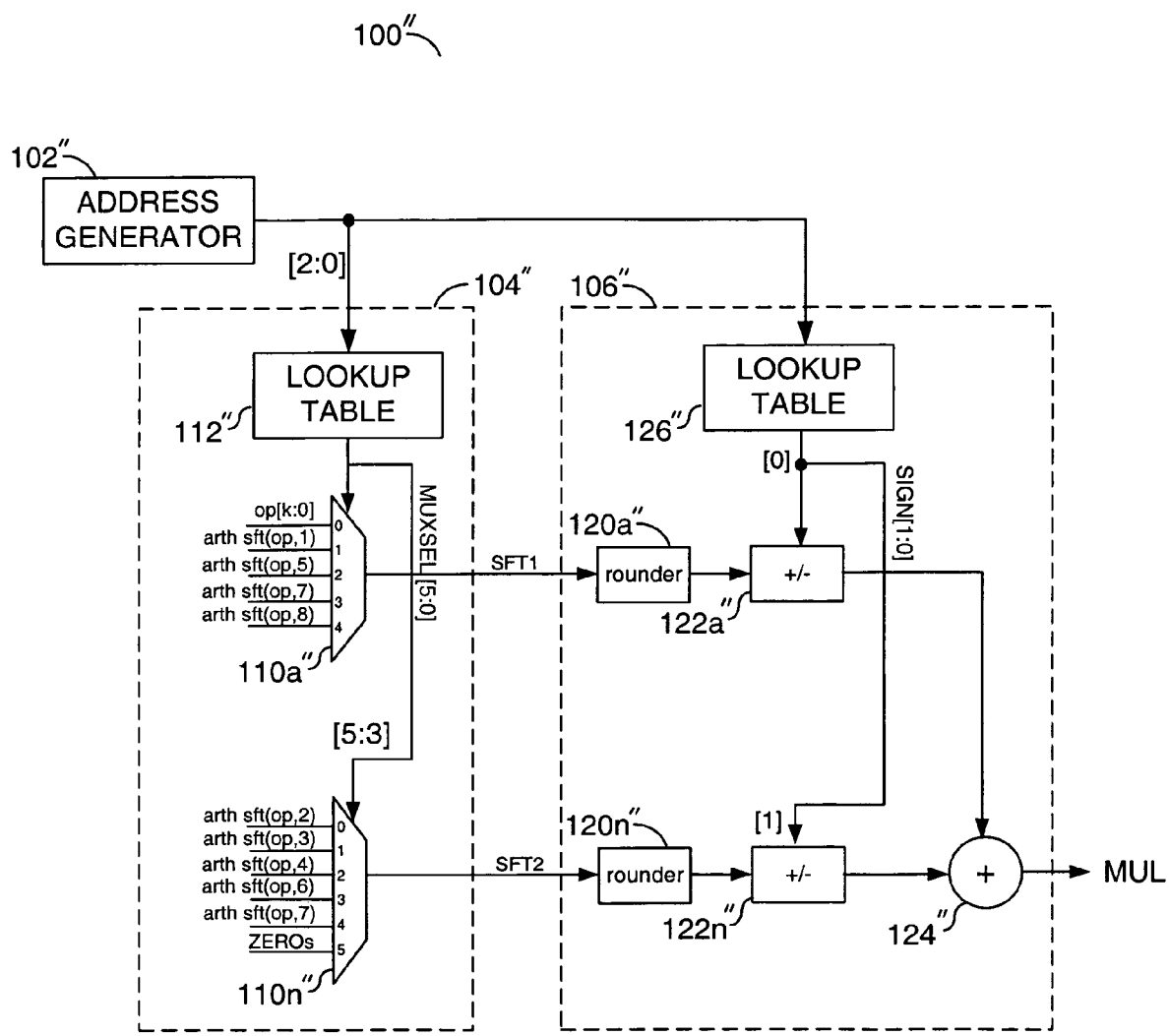
FIG. 3 is a diagram of an implementation of a specific example that uses the present invention with mutually exclusive groups.

Referring to FIG. 3, another example of the present invention is shown. When the coefficients are fixed, optimization may be implemented in order to reduce the gate count. The optimization may be done by grouping the components to mutually exclusive groups. Since the CSD multiplier 100" contains multiplexers 110a"-110n" that each present one unsigned component of the coefficient final product, it may be desirable to reduce the number of inputs of each of the multiplexers 110a"-110nn". Optimization may be implemented by using as many 'Shift by N' inputs as possible for one of the multiplexers 110a"-110nn" and not using them in the other multiplexers 110a"-110nn". In an optimal implementation, the supported 'shift by N' inputs are divided to groups without any repetition. The number of groups may be determined according to the number of components of each coefficient. For example, in case of an optimal implementation, if each coefficient has two one over power of 2 components, and M is 7 (e.g., $\frac{1}{2}^7$ is the smallest component that is needed to represent the coefficient), there are 2 groups and 8 (i.e., N=0 through N=7) arithmetic shift inputs that are supported. In that case, each group contains 4 arithmetic shift inputs.

In a less optimal implementation, repetition of one or more arithmetic shift inputs may exist in more than one group. An optimal or less optimal implementation depends on the coefficients themselves. In some cases, it may be possible to optimize the circuit 100" further than in other cases. However, even with less optimal implementation (e.g., repetitions of some of the inputs) the overall gate count will be lower than the implementation of the circuit 100.

FIG. 3 illustrates an example having the following 15 coefficients, each with up to two one over power of two components, where M is 8:

$$C1 = -1/2^5 - 1/2^7$$
$$C2 = -1/2^4 - 1/2^8$$
$$C3 = -1/2^3 + 1/2^5$$
$$C4 = -1/2^3 + 1/2^7$$
$$C5 = -1/2^3 + 1/2^5$$
$$C6 = -1/2^8$$
$$C7 = 1/2^3 + 1/2^5$$
$$C8 = 1/2^1 - 1/2^3$$
$$C9 = 1/2^1 + 1/2^3$$
$$C10 = 1/2^0 - 1/2^3$$
$$C11 = 1/2^0 - 1/2^6$$
$$C12 = 1/2^0$$
$$C13 = 1/2^0 - 1/2^3$$
$$C14 = 1/2^1 + 1/2^4$$
$$C15 = 1/2^2 - 1/2^5$$

The coefficients may be arranged in a table as shown in the following TABLE 3:

TABLE 3

| | | Coefficients | | | | | | | | | | | | | | |
|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 |
| Shift by $1/2^N$ | N = 0 | | | | | | | | | | 1 | 1 | 1 | 1 | | |
| | N = 1 | | | | | | | | 1 | 1 | | | | | 1 | |
| | N = 2 | | | | | | | | | | | | | | | 1 |
| | N = 3 | | | −1 | −1 | −1 | | 1 | −1 | 1 | −1 | | | −1 | | |
| | N = 4 | | −1 | | | | | | | | | | | | 1 | |
| | N = 5 | −1 | | 1 | | 1 | | 1 | | | | | | | | −1 |
| | N = 6 | | | | | | | | | | | −1 | | | | |
| | N = 7 | −1 | | | 1 | | | | | | | | | | | |
| | N = 8 | | −1 | | | | −1 | | | | | | | | | |

TABLE 3 contains the 15 coefficients that are represented in CSD format. Since each coefficient may be represented with up to two one over power of 2 components, two groups are needed. Various techniques may be used to divide the coefficients to mutually exclusive groups. The following flow explains how to divide the coefficients for 2 groups, but can be easily implemented for more the 2 groups:

1. Select a row and mark all the components in that row as 'Group A'.

2. For each '1' or '−1' in the selected row, mark the other components in the same column as 'Group B'.

3. For each component that was marked as 'Group B', mark all the components in the same row as 'Group B' as well.

4. For each '1' or '−1' in the rows that were marked as 'Group B', mark the other component in the same column as 'Group A'.

5. For each component that was marked as 'Group A', mark all of the components in the same row as 'Group A' as well.

6. For each '1' or '−1' in the rows that were marked as 'Group A', mark the other component in the same column as 'Group B'.

7. Repeat steps 3-6 until all of the rows are marked either by 'Group A', 'Group B' or both.

8. If a row was marked as 'Group A' and 'Group B', the specific component is used as an input in both multiplexers.

9. If a coefficient has only one component, zeros should be supplied in the other branch. Put Zeros in the other group then the component.

Following such a flow, the components in TABLE 3 may be divided as follows: Group 1 may contain shift by 0, 1, 5, 7 and 8. Group 2 may contain shift by 2, 3, 4, 6, 7 and zeros. Note that in this grouping 'Shift by 7' exists in both groups but all the other 'shift by N' inputs exist only in one group.

By using optimization and dividing of the components to mutually exclusive groups, the number of inputs for each multiplexer 110a"-110n" is reduced compared to the circuit 100. The lookup tables 112" and 126" are smaller and may be implemented with a lower gate count.

The following TABLE 4 shows an example of the lookup table 112":

TABLE 4

| Addr | MUXSEL [5:3] | MUXSEL [2:0] |
|---|---|---|
| 0 | 100 | 010 |
| 1 | 010 | 100 |
| 2 | 001 | 010 |
| 3 | 001 | 011 |
| 4 | 001 | 010 |
| 5 | 101 | 100 |
| 6 | 001 | 010 |
| 7 | 001 | 001 |
| 8 | 001 | 001 |
| 9 | 001 | 000 |
| a | 011 | 000 |
| b | 101 | 000 |
| c | 001 | 000 |
| d | 010 | 001 |
| e | 000 | 010 |

The following TABLE 5 illustrates an example of the lookup table 126":

TABLE 5

| Addr | SIGN[1] | SIGN[0] |
|---|---|---|
| 0 | 1 | 1 |
| 1 | 1 | 1 |
| 2 | 1 | 0 |
| 3 | 1 | 0 |
| 4 | 1 | 0 |
| 5 | 0 | 1 |
| 6 | 0 | 0 |
| 7 | 1 | 0 |
| 8 | 0 | 0 |
| 9 | 1 | 0 |
| a | 1 | 0 |
| b | 0 | 0 |
| c | 1 | 0 |
| d | 0 | 0 |
| e | 0 | 1 |

The examples in FIGS. 1-3 may be used to reduce the gate count needed to implement a multiplier. Components may be added or deducted to change the accuracy of the multiplier. The coefficients may be programmable or fixed. When the coefficients are known (or fixed), grouping the one over power of 2 components to mutually exclusive groups may significantly reduce the gate count of a multiplier.

The present invention may provide rounding as follows:

For an operand of OP[7:0]=10110001 (where K is 7), the rounder adds 1 to the number as shown:

$$\frac{10110001 \text{ (input of the rounder)} + 1}{10110010 \text{ (output of the rounder)}}$$

In general, the present invention may be used to add $\frac{1}{2}^K$, since the most significant bit has a weight of $\frac{1}{2}^0$, and the LSB has a weight of $\frac{1}{2}^K$ when represented as a fraction in binary numbers. The index of N of the MSB is 0 and the K for the LSB.

In one example, the present invention may be used in digital filters, such as the transmitter or receiver filters in CDMA2000 mobile communication systems. However, the present invention may be easily generalized to other digital filters or applications.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
   an address generation circuit configured to generate a series of addresses;
   a lookup table configured to generate one or more coefficients in response to said addresses, each one of said coefficients having a plurality of bits;
   a multiplexer circuit configured to generate one or more shifted values by multiplexing one or more operands and a plurality of arithmetically shifted versions of said operands, wherein said multiplexing is controlled by said coefficients such that each of said shifted values represents one of (i) said operands or (ii) said arithmetically shifted versions of said operands multiplied by a corresponding one of said bits; and an output circuit configured to (i) generate one or more component values by rounding said shifted values, (ii) negate selective ones of said component values and (iii) generate an output signal by combining said component values after said negating, wherein (a) said component values are grouped as one over power of 2 components into mutually exclusive groups, (b) each one of said groups corresponds to a respective one of said bits and (c) said output signal is suitable for use in a digital filter.

2. The apparatus according to claim 1, wherein (i) said output circuit is further configured to generate one or more signed values in response to said addresses by using a lookup register and (ii) a negative value on said signed values selects said component values to said negate.

3. The apparatus according to claim 1, wherein:
said multiplexer circuit comprises a plurality of sub-multiplexers that generate a plurality of said shifted values in parallel; and
said output circuit comprises a plurality of rounder circuits that generate said component values in parallel, wherein the number of said sub-multiplexers and said rounders is (i) fewer than that of said bits and (ii) increased to increase an accuracy of said output signal.

4. The apparatus according to claim 1, wherein said one or more coefficients comprise canonical signed digit (CSD) coefficients.

5. The apparatus according to claim 4, wherein said CSD coefficients reduce an overall gate count needed to implement said apparatus.

6. The apparatus according to claim 1, wherein said coefficients are programmable.

7. The apparatus according to claim 1, wherein said coefficients are fixed.

8. The apparatus according to claim 1, wherein said one over power of 2 grouping reduces a gate count of said apparatus.

9. The apparatus according to claim 1, wherein said apparatus forms a canonical signed digit (CSD) coefficient multiplier.

10. An apparatus comprising:
means for generating a series of addresses;
means for generating one or more coefficients in response to said addresses, each one of said coefficients having a plurality of bits;
means for generating one or more shifted values by multiplexing one or more operands and a plurality of arithmetically shifted versions of said operands, wherein said multiplexing is controlled by said coefficients such that each of said shifted values represents one of (i) said operands or (ii) said arithmetically shifted versions of said operands multiplied by a corresponding one of said bits; and
means for (i) generating one or more component values by rounding said shifted values, (ii) negating selective ones of said component values, and (iii) generating an output signal by combining said component values after said negating, wherein (a) said component values are grouped as one over power of 2 components into mutually exclusive groups, (b) each one of said groups corresponds to a respective one of said bits and (c) said output signal is suitable for use in a digital filter.

11. The apparatus according to claim 10, further comprising a lookup register means for generating one or more signed values in response to said addresses, wherein a negative value on said signed values selects said component values to said negate.

12. A method for implementing a multiplier comprising the steps of:
(A) generating a series of addresses;
(B) generating one or more coefficients from a lookup table in response to said addresses, each one of said coefficients having a plurality of bits;
(C) generating one or more shifted values by multiplexing one or more operands and a plurality of arithmetically shifted versions of said operands, wherein said multiplexing is controlled by said coefficients such that each of said shifted values represents one of (i) said operands or (ii) said arithmetically shifted versions of said operands multiplied by a corresponding one of said bits;
(D) generating one or more component values by rounding said shifted values;
(E) negating selective ones of said component values; and
(F) generating an output signal by combining said component values after said negating, wherein (i) said component values are grouped as one over power of 2 components into mutually exclusive groups, (ii) each one of said groups corresponds to a respective one of said bits and (iii) said output signal is suitable for use in a digital filter.

13. The method according to claim 12, further comprising the step of:
generating one or more signed values in response to said addresses by using a lookup register, wherein a negative value on said signed values selects said component values to said negate.

14. The method according to claim 12, wherein:
step (C) is implemented using a plurality of sub-multiplexers that generate a plurality of said shifted values in parallel; and
step (D) is implemented using a plurality of rounder circuits that generate said component values in parallel, wherein the number of said sub-multiplexers and said rounders is (i) fewer than that of said bits and (ii) increased to increase an accuracy of said output signal.

15. The method according to claim 12, wherein said one or more coefficients comprise canonical signed digit (CSD) coefficients.

16. The method according to claim 15, wherein said CSD coefficients reduce an overall gate count needed to implement said method.

17. The method according to claim 12, wherein said coefficients are programmable.

18. The method according to claim 12, wherein said coefficients are fixed.

19. The method according to claim 12, wherein said one over power of 2 grouping reduces a gate count when implementing said method.

20. The method according to claim 12, wherein said method is implemented in a canonical signed digit (CSD) coefficient multiplier.

* * * * *